(12) United States Patent
Przygodda et al.

(10) Patent No.: US 7,990,594 B2
(45) Date of Patent: Aug. 2, 2011

(54) PHASE MASK FOR HOLOGRAPHIC DATA STORAGE

(75) Inventors: Frank Przygodda, Villingen-Schwenningen (DE); Joachim Knittel, Tuttlingen (DE)

(73) Assignee: Thomson Licensing, Boulogne-Billancourt (FR)

( * ) Notice: Subject to any disclaimer, the term of this patent is extended or adjusted under 35 U.S.C. 154(b) by 336 days.

(21) Appl. No.: 12/218,002

(22) Filed: Jul. 10, 2008

(65) Prior Publication Data

US 2009/0051990 A1 Feb. 26, 2009

(30) Foreign Application Priority Data

Aug. 21, 2007 (EP) .................................. 07114691

(51) Int. Cl.
*G02B 5/32* (2006.01)
(52) U.S. Cl. ............................................ 359/21; 359/29
(58) Field of Classification Search .................... 359/11, 359/21, 29
See application file for complete search history.

(56) References Cited

U.S. PATENT DOCUMENTS

| | | | |
|---|---|---|---|
| 3,829,193 A | 8/1974 | Tsunoda et al. | |
| 5,317,435 A | 5/1994 | Kasazumi | |
| 6,281,993 B1 | 8/2001 | Bernal et al. | |
| 7,088,482 B2 * | 8/2006 | Edwards | 359/11 |
| 7,576,899 B2 * | 8/2009 | Kanesaka et al. | 359/21 |
| 2007/0133113 A1 | 6/2007 | Minabe et al. | |
| 2009/0284814 A1 * | 11/2009 | Schuurmans et al. | 359/30 |

FOREIGN PATENT DOCUMENTS

WO    WO 97/32243 A    9/1997

OTHER PUBLICATIONS

Search Report Dec. 11, 2007.
The Institution of Electrical Engineers, Stevenage, GB.; (Jan. 15, 1980), Iwamoto A: "Artificial diffuser for Fourier transform hologram recording" XP002461933 Database accession No. 1511793 p. 219; figure 4 & Applied Optics USA, vol. 19, No. 2. (Jan. 15, 1980), pp. 215-221, ISSN: 0003-6935.

* cited by examiner

*Primary Examiner* — Alessandro Amari
(74) *Attorney, Agent, or Firm* — Robert D. Shedd; Joseph J. Opalach; Jerome G. Schaefer

(57) ABSTRACT

The present invention relates to a phase mask for holographic data storage, and to a method and an apparatus for reading from and/or writing to holographic storage media using such a phase mask.

According to the invention, the phase mask has a plurality of phase cells, whose size is equal to an integer multiple of the size of the pixels of a spatial light modulator of the apparatus. The phase cells have a phase variation on sub-cell scale, which is inverse for essentially half the number of phase cells.

6 Claims, 8 Drawing Sheets

PHASE MASK FOR HOLOGRAPHIC DATA STORAGE

This application claims the benefit, under 35 U.S.C. §119, of European Patent Application No. 07114691.4 filed Aug. 21, 2007.

FIELD OF THE INVENTION

The present invention relates to a phase mask for holographic data storage, and to a method and an apparatus for reading from and/or writing to holographic storage media using such a phase mask.

BACKGROUND OF THE INVENTION

In holographic data storage digital data are stored by recording the interference pattern produced by the superposition of two coherent laser beams, where one beam, the so-called 'object beam', is modulated by a spatial light modulator (SLM) and carries the information to be recorded. The second beam serves as a reference beam. The interference pattern leads to modifications of specific properties of the storage material, which depend on the local intensity of the interference pattern. Reading of a recorded hologram is performed by illuminating the hologram with the reference beam using the same conditions as during recording. This results in the reconstruction of the recorded object beam.

One advantage of holographic data storage is an increased data capacity. Contrary to conventional optical storage media, the volume of the holographic storage medium is used for storing information, not just a few layers. One further advantage of holographic data storage is the possibility to store multiple data in the same volume, e.g. by changing the angle between the two beams or by using shift multiplexing, etc. Furthermore, instead of storing single bits, data are stored as data pages. Typically a data page consists of a matrix of light-dark-patterns, i.e. a two dimensional binary array or an array of grey values, which code multiple bits. This allows to achieve increased data rates in addition to the increased storage density. The data page is imprinted onto the object beam by the spatial light modulator and detected with an array detector.

As described above, in page-oriented holographic data storage a pixelated spatial light modulator is used for modulating the object beam intensity with information. This intensity distribution is usually Fourier transformed by an objective lens. The Fourier transform, i.e. the spectrum of a pixelated data pattern has a high central intensity peak, hereafter referred to as DC-peak. The actual information is distributed around this peak on a much lower level, typically −60 dB. The DC-peak of the object beam can cause an undesired saturation of the photosensitive medium. The envelope of the surrounding intensity distribution can be described by a 2-dimensional sinc-function (sin (x)/x), which results from the usual square-like shape of the pixels. The full information about the SLM pixel pattern is located below the so-called Nyquist limit which lies at half the distance to the first zero of the sinc-function.

In order to suppress the DC-peak it has been proposed to apply a phase modulation in addition to the intensity modulation. For example, in M. J. O'Callaghan: "Sorting through the lore of phase mask options—performance measures and practical commercial designs", Proc. SPIE Vol. 5362 (2004), pp. 150-159, different types of pixelated and non-pixelated phase masks are discussed. Typically, however, a binary phase mask is used for this purpose, which introduces a phase shift of 0 or $\pi$ with respect to the laser wavelength. The phase cells, i.e. the areas with constant phase, have a size of one or more pixels of the SLM. The spatial distribution of 0 and $\pi$ cells is random or pseudo random, the total number of 0 and $\pi$ cells is essentially the same.

A phase mask with a cell size of one SLM pixel suppresses the DC-peak quite well. However, a large fraction of intensity is still located above the Nyquist limit. This fraction is redundant and does not contain necessary data information. Furthermore, because of the sinc-like envelope, the intensity distribution is not flat within the central region of the Fourier plane or in the holographic medium, respectively.

This drawback is overcome by a phase mask having a phase modulation with a lower spatial resolution than the SLM. Such a phase mask lead to a narrower intensity distribution in the Fourier plane. Therefore, it reduces the unnecessary intensity above the Nyquist limit, whereas the important intensity below the Nyquist limit is increased.

SUMMARY OF THE INVENTION

It is an object of the invention to propose a phase mask for holographic data storage, which further improves the intensity distribution of a light beam in a Fourier plane of a holographic storage system.

According to the invention, this object is achieved by a phase mask for holographic data storage having a plurality of phase cells, wherein the phase cells have a phase variation on sub-cell scale.

The invention proposes to apply a special phase distribution within each phase cell. If the cell size is the same as the SLM pixel size, this means a phase variation on a sub-pixel scale. The special phase distribution on sub-cell scale affects the intensity distribution in the Fourier plane in such way that its envelope becomes flatter. As a consequence the illumination of the holographic storage medium is more balanced and a possible saturation is avoided. This allows to achieve stronger holograms with a better signal-to-noise ratio (SNR) or a larger number of multiplexed holograms, i.e. an increased capacity.

Preferably, the size of the phase cells is equal to an integer multiple of the size of the pixels of the SLM. As stated above, when the phase cell size is equal to the size of the SLM pixels, the envelope of the intensity distribution in the Fourier plane become flatter. If the size of the phase cells is increased to an integer multiple of the SLM pixel size, for example if one phase cell is associated to four SLM pixels, the intensity above the Nyquist limit is reduced, whereas the intensity below the Nyquist limit is increased. This further improves the illumination of the holographic storage medium. The size of the phase cells is preferably identical in perpendicular directions within the plane of the phase mask, e.g. each phase cell is associated to 2×2, 3×3, etc. SLM pixels. Of course, it is likewise possible to use different sizes in both directions, e.g. 1×2, 2×3, etc. SLM pixels.

Advantageously, a special pattern of the phase variation is at least one of a circular, rectangular, ring-like, polygon-like, or pixelated pattern, or a combination of these patterns. Such patterns offer the advantage that they can be relatively easy manufactured. Of course, different phase cells can have different phase variations, i.e. different patterns.

Preferably, the phase variation is inverse for half the number of phase cells. This solution automatically ensures a balanced occurrence of $\pi$ and 0 phase shifts. It is likewise feasible that the inverse pattern differs from the regular pattern.

Advantageously, the phase mask introduces a binary or a multi level phase shift. Alternatively, is introduces random distributed phase shifts, e.g. Gaussian distributed. The spatial distribution of 0 and π cells is random or pseudo random. Likewise, also the spatial distribution of phase cells with different patterns is random or pseudo random.

Preferentially, the phase mask is a transparent optical element with a varying surface height or a varying refractive index. This allows to generate the necessary phase shifts very easily. Alternatively, the phase mask is a reflective optical element with a varying surface height. This is especially useful when a reflective element is needed in the optical path anyway.

According to a further refinement of the invention, the phase mask has a switchable phase distribution or switchable phase shifts. In this way the phase mask can be adapted to different types of holographic storage media, or to different operating conditions.

Advantageously, an apparatus for reading from and/or writing to holographic storage media includes a phase mask according to the invention in an optical path of an object beam. Such an apparatus modifies the phase distribution of the object beam upon writing to the holographic storage medium. This leads to an improved, more homogeneous illumination of the holographic storage medium. This allows to achieve stronger holograms with a better signal-to-noise ratio (SNR) or a larger number of multiplexed holograms, i.e. an increased capacity.

Preferably, a further phase mask is included in an optical path of a reference beam. This has the advantage that a good overlap of the object beam and the reference beam inside the holographic storage medium is ensured. The further phase mask may have the same phase variation as or a different phase variation than the phase mask included in the optical path of the object beam.

Advantageously, the phase mask is an integral part of the SLM. In this way the SLM generates both the data page and the modified phase distribution, so that no additional component is necessary.

BRIEF DESCRIPTION OF THE DRAWINGS

For a better understanding the invention shall now be explained in more detail in the following description with reference to the figures. It is understood that the invention is not limited to this exemplary embodiment and that specified features can also expediently be combined and/or modified without departing from the scope of the present invention. In the figures.

DETAILED DESCRIPTION OF PREFERRED EMBODIMENTS

Figure 1:
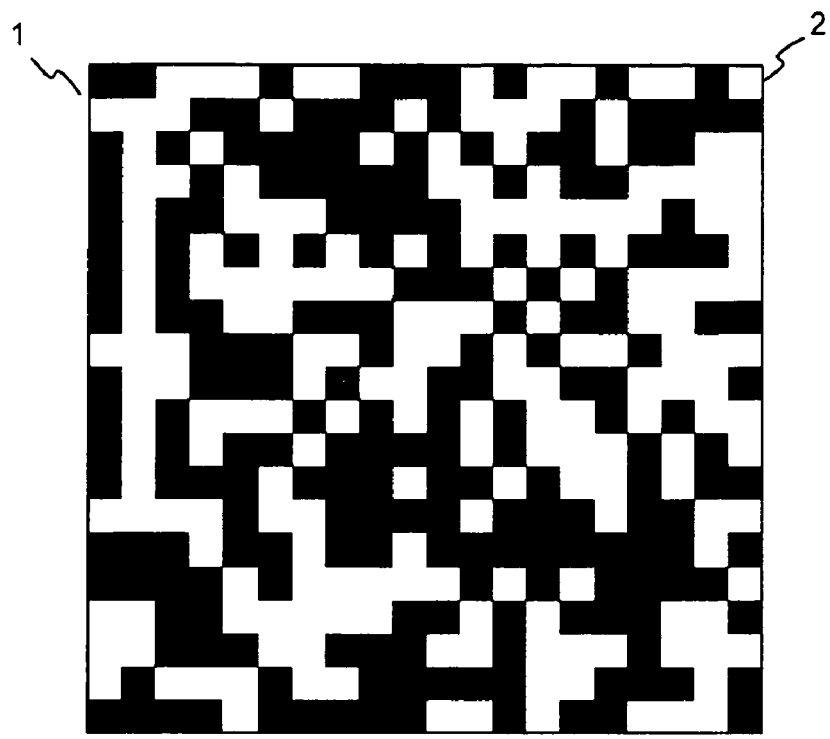
FIG. 1 shows an SLM with a data pattern.

FIG. 1 shows an SLM 1 with a data pattern consisting of a plurality of pixels 2. In this figure, "off-pixels" are symbolized by black pixels, whereas "on-pixels" are symbolized by white pixels. For page oriented data storage usually a 2-dimensional modulation scheme is applied. A common approach is to divide each data page 1 into a set of sub pages or blocks consisting, for example, of 4×4 or 5×5 pixels 2. During modulation the user data is transformed into a set of blocks. A known modulation uses three on-pixels in each 4×4 SLM block (4×4-3 modulation). The number of combinations of three on-pixels in a 4×4 SLM pixel block is equal to the selection of 3 out of 16, i.e. the number of combinations equals 560. This corresponds to a capacity of ~9.1 bits of user data per pixel block.

Figure 2:
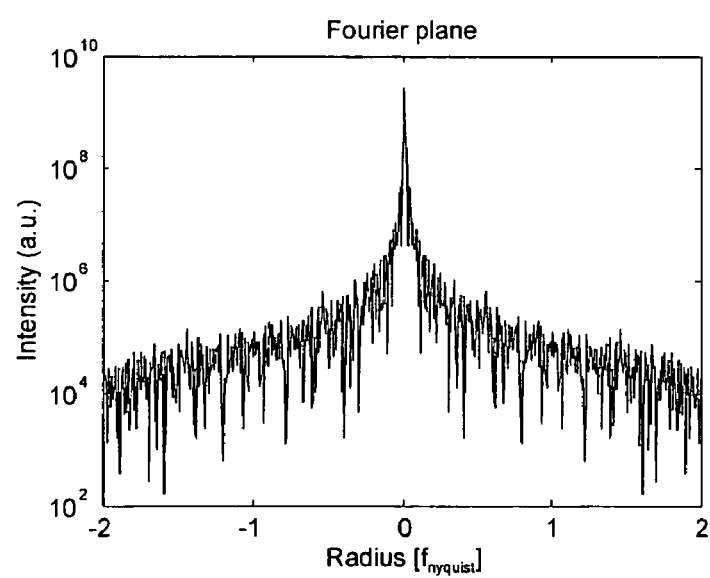
FIG. 2 shows the resulting intensity distribution in the Fourier plane.

FIG. 2 shows the intensity distribution in the Fourier plane resulting from the distribution of pixels 2 of the data page 1 of FIG. 1. Illustrated is a cut through the 2-dimensional distribution in logarithmic scale. As can be seen, the Fourier transform has a high central intensity peak. This DC-peak of the object beam is likely to cause an undesired saturation of the photosensitive medium.

Figure 3:
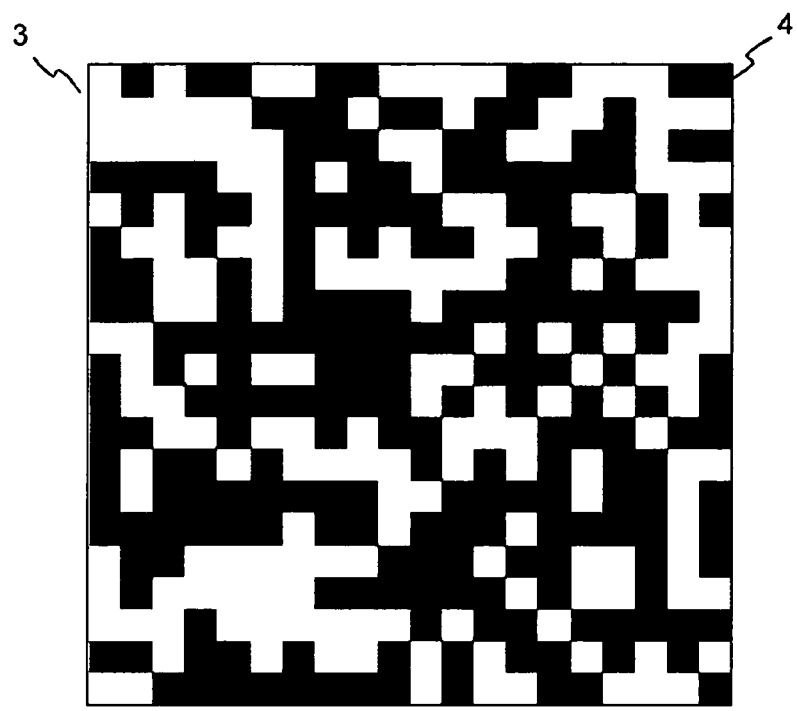
FIG. 3 illustrates a phase mask having a cell size equal to the SLM pixel size, which introduces a phase shift of 0 or π for each pixel.

Illustrated in FIG. 3 is a phase mask 3 having a plurality of phase cells 4, which introduce a phase shift of 0 or π for each pixel 2. The spatial distribution of the phase shift of 0 or π is random. The size of the phase cells 4 of the phase mask 3 is the same as the size of the pixels 2 of the SLM 1. Of course, if the size of the pixels 2 at the position of the phase mask 3 is different from the size of the pixels 2 at the position of the SLM 1, e.g. due to imaging, the size of the phase cells 4 is adapted accordingly. In other words, a single phase cell 4 is assigned to each pixel 2.

Figure 4:
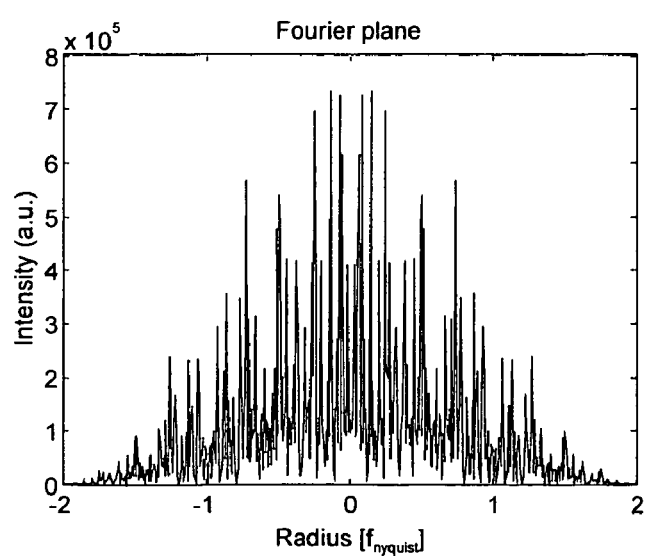
FIG. 4 illustrates the resulting intensity distribution in the Fourier plane.

FIG. 4 illustrates the intensity distribution in the Fourier plane resulting from the distribution of pixels 2 of the data page 1 of FIG. 1 modulated with the phase mask 3 of FIG. 3. Shown is a cut through the 2-dimensional distribution in linear scale. The phase mask with a cell size of one SLM pixel suppresses the DC-peak quite well. However, a large fraction of intensity is still located above the Nyquist limit. In addition, the intensity distribution within the central region of the Fourier plane is not flat.

Figure 5:
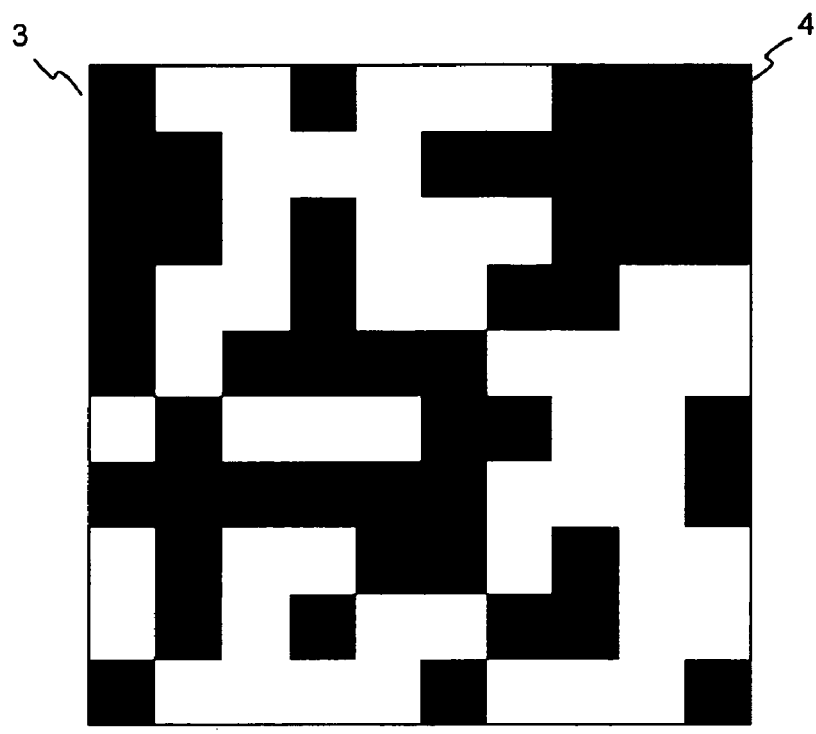
FIG. 5 illustrates a phase mask having a cell size two times larger than the SLM pixel size, which introduces a phase shift of 0 or π for each pixel.

FIG. 5 shows a phase mask 3 having a cell size two times larger than the SLM pixel size. This means that a single phase cell 4 is assigned to four pixels 2 of the SLM 1. Again, the phase cells 4 introduce a phase shift of 0 or π for each pixel. The spatial distribution of the phase shift of 0 or π is random.

Figure 6:
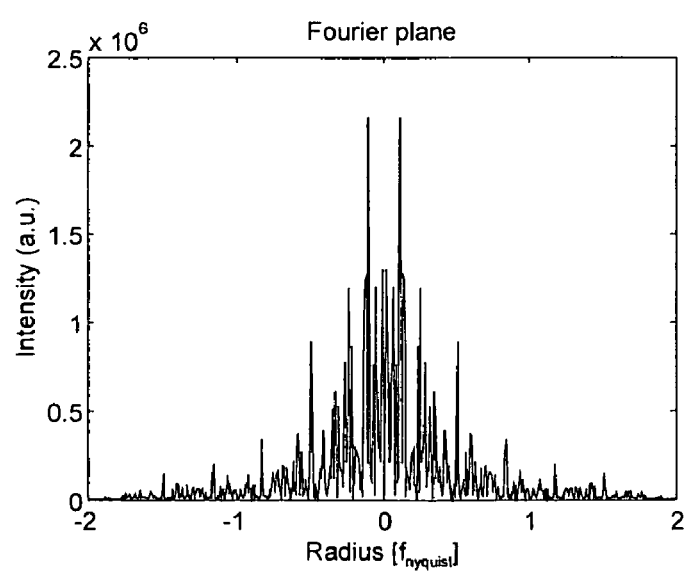
FIG. 6 shows the resulting intensity distribution in the Fourier plane.

FIG. 6 depicts the intensity distribution in the Fourier plane resulting from the distribution of pixels 2 of the data page 1 of FIG. 1 modulated with the phase mask 3 of FIG. 5. Shown is a cut through the 2-dimensional distribution in linear scale. The phase mask 3 reduces the intensity above the Nyquist limit, i.e. outside the interval [−1, 1], whereas the intensity below the Nyquist limit is increased.

Figure 7:
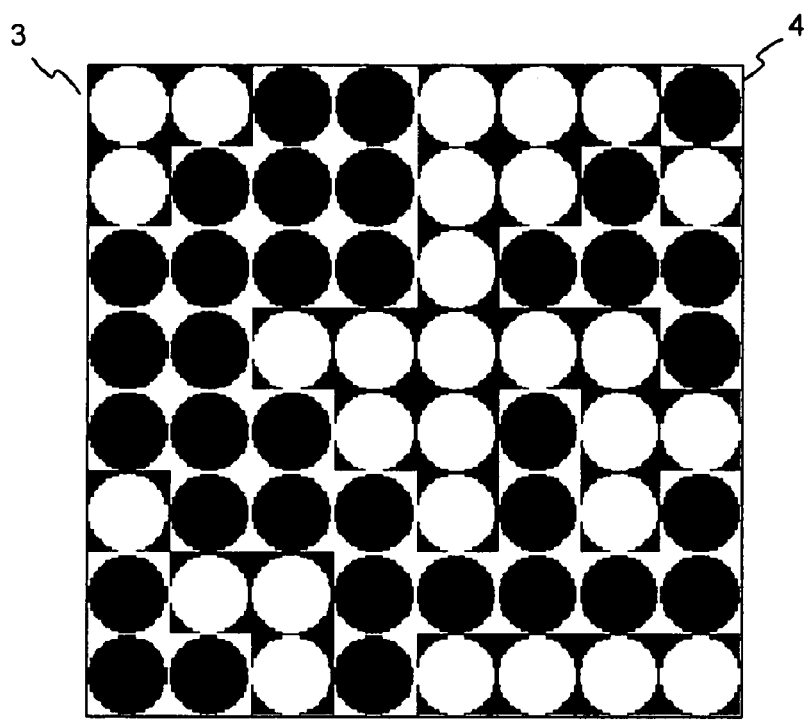
FIG. 7 illustrates a first embodiment of a binary phase mask according to the invention.

A first embodiment of a phase mask 3 according to the invention is illustrated in FIG. 7. Each phase cell causes a phase shift of 0 or π, i.e. the phase mask 3 is binary. However, the phase shift varies within each phase cell 4. Inside a circular area of each phase cell 4 the phase shift is different from the phase shift in the surrounding area. If the phase shift within the circular area is π, the phase shift in the surrounding area is 0, and vice versa. The phase mask 3 is still binary. Of course, the invention can likewise be realized with a multi-level phase mask.

Figure 8:
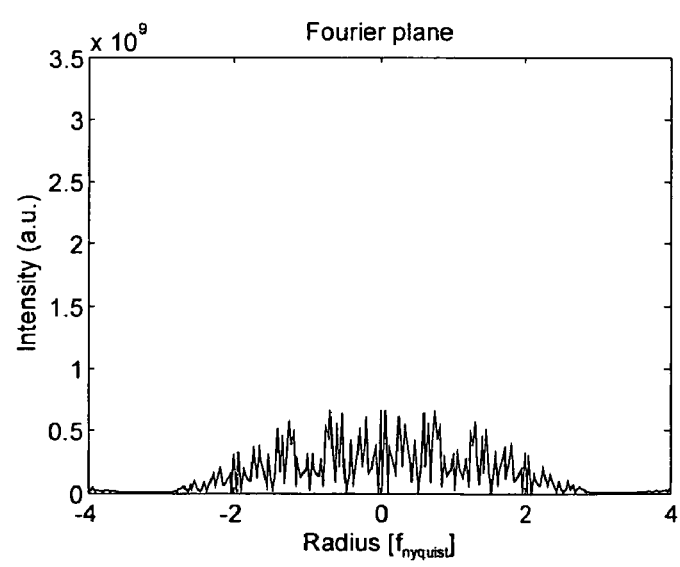
FIG. 8 shows the resulting intensity distribution in the Fourier plane.

FIG. 8 depicts the intensity distribution in the Fourier plane resulting from the distribution of pixels 2 of the data page 1 of FIG. 1 modulated with the phase mask 3 of FIG. 7. Shown is a cut through the 2-dimensional distribution in linear scale. As can be seen, the resulting intensity distribution has a flatter envelope.

Figure 9:
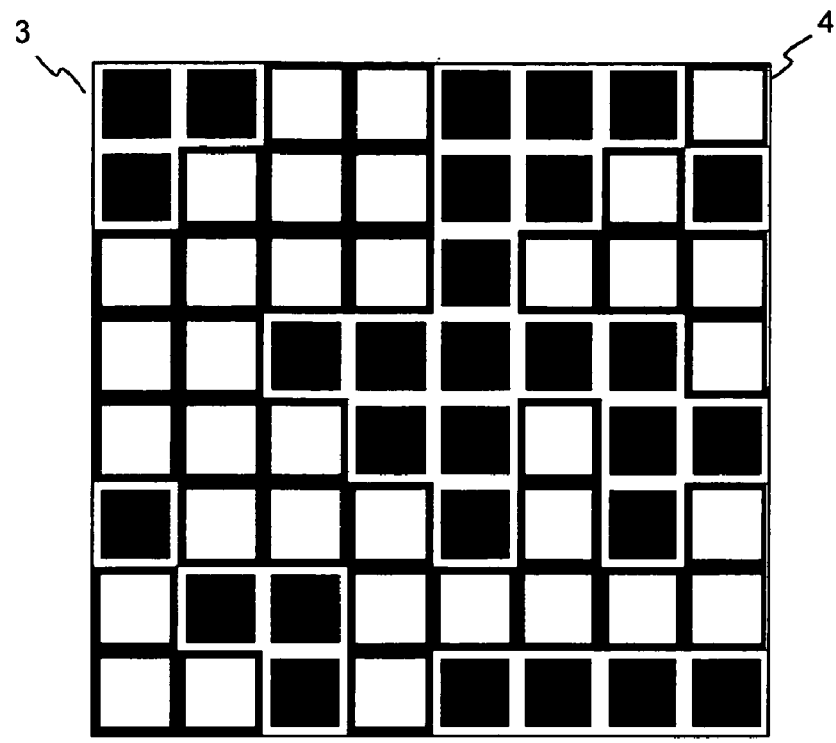
FIG. 9 illustrates a second embodiment of a binary phase mask according to the invention.

A second embodiment of a phase mask 3 according to the invention is illustrated in FIG. 9. Here a square-shaped pattern is used instead of the circular pattern of FIG. 7.

Figure 10:
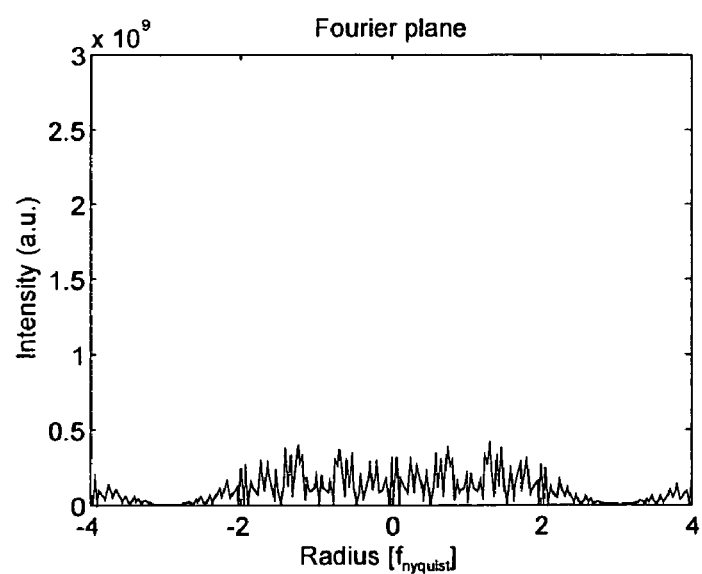
FIG. 10 shows the corresponding intensity distribution in the Fourier plane.

The intensity distribution in the Fourier plane resulting from the distribution of pixels 2 of the data page 1 of FIG. 1 modulated with the phase mask 3 of FIG. 9 is depicted in FIG. 10. Shown is a cut through the 2-dimensional distribution in linear scale. The resulting intensity distribution has an even flatter envelope.

Figure 11:
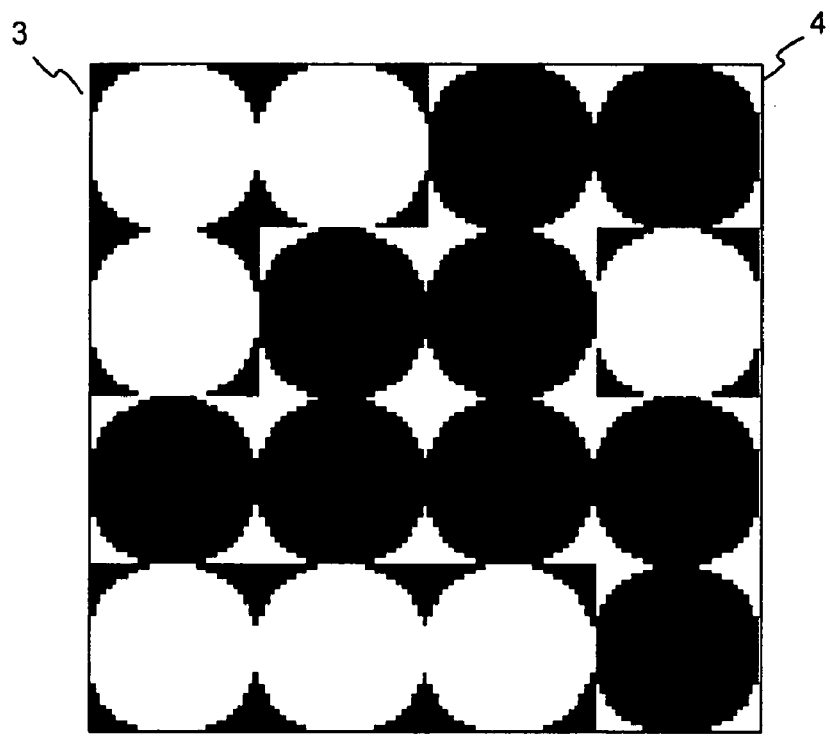
FIG. 11 illustrates a third embodiment of a binary phase mask according to the invention.

A third embodiment of a phase mask 3 according to the invention is illustrated in FIG. 11. Here the sub-cell phase variation of FIG. 7 using a circular-shaped pattern is combined with the low-resolution phase mask 3 depicted in FIG. 5.

Figure 12:
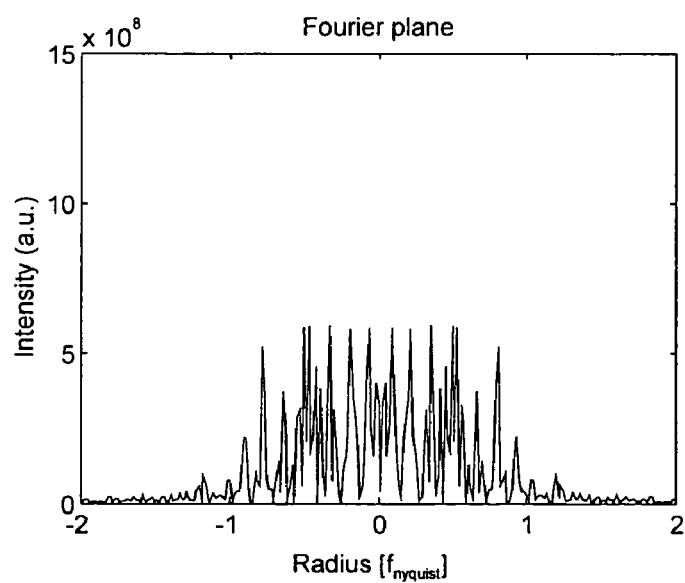
FIG. 12 shows the corresponding intensity distribution in the Fourier plane.

The intensity distribution in the Fourier plane resulting from the distribution of pixels 2 of the data page 1 of FIG. 1 modulated with the phase mask 3 of FIG. 11 is depicted in FIG. 12. Shown is a cut through the 2-dimensional distribution in linear scale. The intensity distribution is concentrated below the Nyquist limit and at the same time has a flat envelope.

Figure 13:
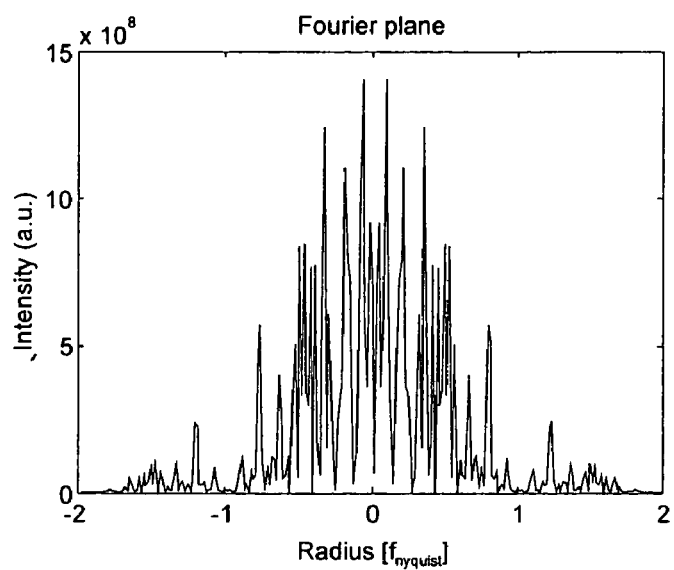
FIG. 13 shows the intensity distribution in the Fourier plane without the sub-cell phase variation for comparison.

For comparison FIG. 13 depicts the corresponding intensity distribution in the Fourier plane without the sub-cell phase variation. The intensity distribution is still concentrated below the Nyquist limit, but the envelope is no longer flat.

Figure 14:
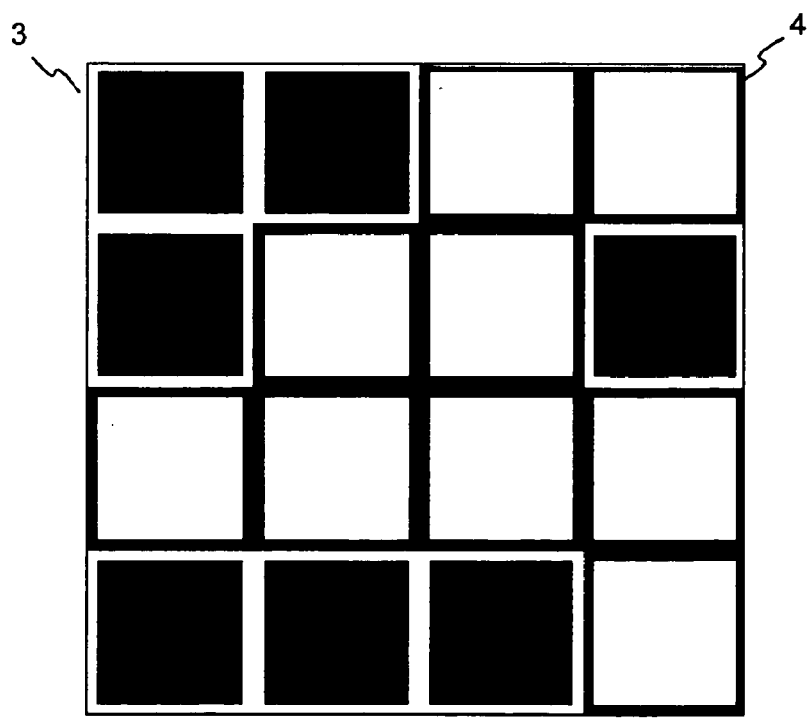
FIG. 14 illustrates a fourth embodiment of a binary phase mask according to the invention.

FIG. 14 shows a fourth embodiment of a phase mask 3 according to the invention. In this embodiment the sub-cell phase variation of FIG. 9 using a square-shaped pattern is combined with the low-resolution phase mask 3 depicted in FIG. 5.

Figure 15:
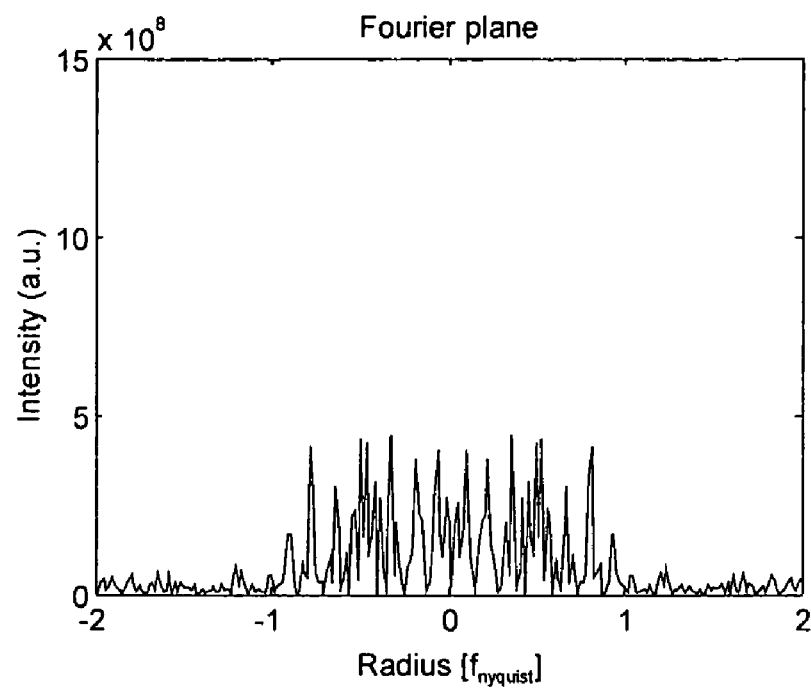
FIG. 15 shows the corresponding intensity distribution in the Fourier plane.

The intensity distribution in the Fourier plane resulting from the distribution of pixels 2 of the data page 1 of FIG. 1 modulated with the phase mask 3 of FIG. 14 is depicted in FIG. 15. Shown is a cut through the 2-dimensional distribution in linear scale. Again the intensity distribution is concentrated below the Nyquist limit. At the same time the envelope is even flatter.

Figure 16:
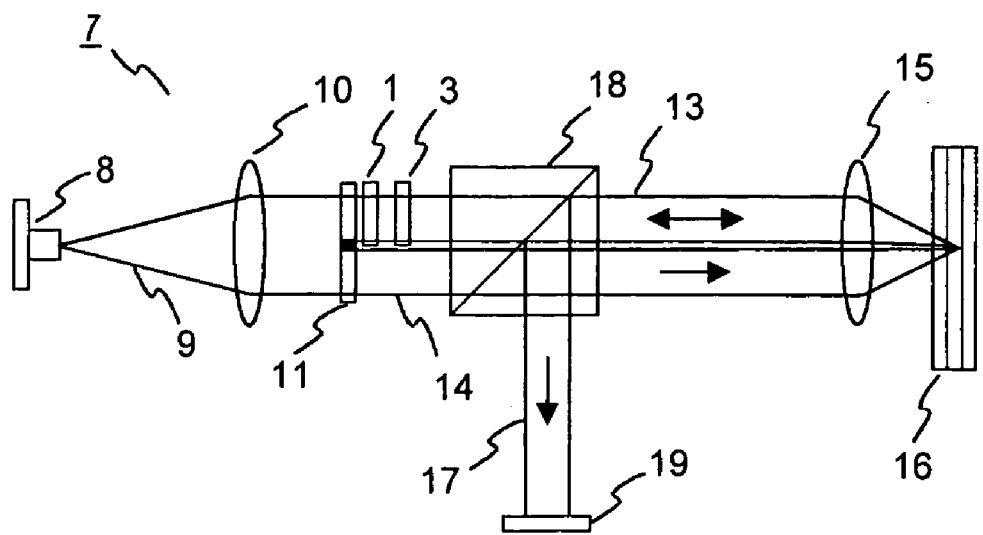
FIG. 16 depicts an apparatus for reading from and/or writing to a holographic storage medium using a phase mask according to the invention.

In FIG. 16 an apparatus 7 for reading from and/or writing to a holographic storage medium 16 is shown schematically. A source of coherent light, e.g. a laser diode 8, emits a light beam 9, which is collimated by a collimating lens 10. The light beam 9 is then divided into two separate light beams 13, 14, i.e. the object beam 13 and the reference beam 14. In the example the division of the light beam 9 is achieved using a first beam splitter 11. However, it is likewise possible to use other optical components for this purpose. A spatial light modulator (SLM) 1 modulates the object beam 13 to imprint a 2-dimensional data pattern. Located behind the SLM 1 is a phase mask 3, which adds a sub-cell scale phase variation to the data pixels of the data pattern. A further, identical or different phase mask (not shown) can likewise be included in the reference beam path. Both the object beam 13 and the reference beam 14 are focused into a holographic storage medium 16, e.g. a holographic disk or card, by an objective lens 15. At the intersection of the object beam 13 and the reference beam 14 an interference pattern appears, which is recorded in a photo-sensitive layer of the holographic storage medium 16.

The stored data are retrieved from the holographic storage medium 16 by illuminating a recorded hologram with the reference beam 14 only. The reference beam 14 is diffracted by the hologram structure and produces a copy of the original object beam 13, the reconstructed object beam 17. This reconstructed object beam 17 is collimated by the objective lens 9 and directed onto a 2-dimensional array detector 19, e.g. a CCD-array, by a second beam splitter 18. The array detector 19 allows to reconstruct the recorded data.

What is claimed is:

1. An apparatus for reading from and/or writing to holographic storage media, with a spatial light modulator and a phase mask with a plurality of rectangular phase cells, wherein each of the rectangular phase cells is associated to n times m pixels of the spatial light modulator, n and m being integer numbers, such that borders between adjacent phase cells coincide with borders between adjacent pixels of the spatial light modulator, and wherein each rectangular phase cell has a binary or multi level phase variation on sub-cell scale, the sub-cell scale phase variation being one of a circular, a ring-like, or a polygon-like pattern, or a combination of these patterns and wherein essentially half the number of phase cells having an identical first sub-cell phase variation and the remaining phase cells having an identical second sub-cell phase variation, which is the inverse of the first sub-cell phase variation.

2. The apparatus according to claim 1, wherein the phase mask is a transparent optical element with either a varying surface height or a varying refractive index or a switchable phase distribution or switchable phase shifts, or wherein the phase mask is a reflective optical element with a varying surface height.

3. The apparatus according to claim 1, wherein the phase mask is arranged in an optical path of an object beam.

4. The apparatus according to claim 1, wherein the phase mask is arranged in an optical path of a reference beam.

5. The apparatus according to claim 1, wherein the phase mask is an integral part of the spatial light modulator.

6. A method for writing to holographic storage media, the method having the steps of:
modifying the phase distribution of an object beam with a phase mask with a plurality of rectangular phase cells, wherein each of the rectangular phase cells is associated to n times m pixels of a spatial light modulator for the object beam, n and m being integer numbers, such that the borders between adjacent phase cells coincide with borders between adjacent pixels of the spatial light modulator, and wherein each rectangular phase cell has a binary or multi-level sub-cell scale phase variation, wherein the sub-cell scale phase variation is one of a circular, ring-like, or a polygon-like pattern, or a combination of these patterns, and wherein essentially half the number of phase cells having an identical first sub-cell phase variation and the remaining phase cells having an identical second sub-cell phase variation, which is the inverse of the first sub-cell phase variation.

* * * * *